US005726282A

United States Patent [19]
Jenekhe et al.

[11] Patent Number: 5,726,282
[45] Date of Patent: Mar. 10, 1998

[54] LIGHT EMITTING DIODE

[75] Inventors: Samson A. Jenekhe, Fairport; John A. Osaheni, Rochester, both of N.Y.

[73] Assignee: Research Corporation Technologies, Inc., Tucson, Ariz.

[21] Appl. No.: 666,039

[22] Filed: Jun. 19, 1996

Related U.S. Application Data

[62] Division of Ser. No. 146,266, Nov. 1, 1993, Pat. No. 5,567,799.

[51] Int. Cl.$^6$ .................. C08G 69/42; H01L 29/861; H01L 29/88
[52] U.S. Cl. .................. 528/337; 528/179; 528/183; 528/336; 528/377; 430/346; 359/300; 257/104
[58] Field of Search ................ 430/346; 257/104; 359/300; 528/337, 183, 179, 336, 377

[56] References Cited

U.S. PATENT DOCUMENTS

| | | | |
|---|---|---|---|
| 4,225,700 | 9/1980 | Wolfe et al. | 528/337 |
| 4,359,567 | 11/1982 | Evers | 528/337 |
| 4,533,692 | 8/1985 | Wolfe et al. | 528/337 |
| 4,533,724 | 8/1985 | Wolfe et al. | 528/337 |
| 4,703,103 | 10/1987 | Wolfe et al. | 528/337 |
| 4,772,678 | 9/1988 | Sybert et al. | 528/337 |
| 5,104,960 | 4/1992 | Inbasekaran et al. | 528/337 |
| 5,142,343 | 8/1992 | Hosokawa et al. | 257/103 |
| 5,236,980 | 8/1993 | Jenekhe et al. | 528/337 |

FOREIGN PATENT DOCUMENTS

| | | |
|---|---|---|
| 0 517 542A1 | 12/1992 | European Pat. Off. . |
| 0 532 798A1 | 3/1993 | European Pat. Off. . |
| US94/12322 | 10/1994 | WIPO . |

OTHER PUBLICATIONS

Encyclopedia of Electronics & Computers, Sybil P. Parker, Editor McGraw-Hill, New York, p. 457, "Light Emitting Diode". The Date of Publication is not Available.

Jenekhe, et al. (Aug. 3, 1899) "Solubilization, Solutions and Processing or Aromatic Heterocyclic Rigid Rod Polymers in Aprotic Organic Solvents: Poly(p-phenylene-2, 6-benzobisthiazolediyl) (PBT)", *Macromolecules* 22: 3216–3222.

Jenekhe, et al. (Jan. 29, 1990) "Complexation-Mediated Solubilization and Processing of Rigid-Chain and Ladder Polymers in Aprotic Organic Solvents", *Macromolecules* 23:4419–4429.

Osaheni, et al. (1992) "New Sulfur-Based Heterocyclic Conjugated Polymers for Electronics and Photonics", *Proc. ACS Div. Pol. Mat: Sci. and Eng.* 67:474–475.

Rao, et al. (May 5, 1986) "Third Order Nonlinear Optical Interactions in Thin Films of Poly-p-phenylenebenzo-,bisthiazole Polymer Investigated by Picosecond and Subpicosecond Degenerate Four Wave Mixing", *Appl. Phys. Lett.* 48:1187–1189.

Sariciftci, et al. (Nov. 27, 1992) "Photoinduced Electron Transfer from a Conducting Polymer to Buckminsterfullerene", *Science* 258:1474–1476.

Shen, et al. (Jul. 1982) "Vibrational Spectroscopic Characterization of Rigid Rod Polymers: 3. Microstructural Changes in Stressed Polymers", *Polymer* 23:969–973.

Vanherzeele, et al. (Feb. 18, 1991) "Third-Order Nonlinear Optical Properties of Thin Films of Poly(p-phenylene benzobisthiazole) and its Molecular Composites with Polyamides", *Appl. Phys. Lett.* 58:663–665.

Wolfe, et al. (Aug. 28, 1981) "Rigid-Rod Polymers. 2. Synthesis and Thermal Properties of Para-Aromatic Polymers with 2, 6-Benzobisthiazole Units in the Main Chain", *Macromolecules* 14:915–920.

Yokoyama, et al. (Mar. 22, 1990) "Synthesis of Ultra-Thin Films of Poly(vinylenebenzothiazole) at Air/Water Interface", *Chemistry Letters*:779–782.

*Primary Examiner*—P. Hampton-Hightower
*Attorney, Agent, or Firm*—Scully, Scott, Murphy & Presser

[57] ABSTRACT

A class of rigid rod and latter polymers having light emitting capability is provided. Included in this class of polymers are those having novel repeating structural units. These rigid rod and ladder polymers are employed in light emitting diodes.

31 Claims, 3 Drawing Sheets

LIGHT EMITTING DIODE

This is a divisional of application Ser. No. 08/146,266, filed on Nov. 1, 1993, U.S. Pat. No. 5,567,799.

GOVERNMENT LICENSE RIGHTS

This invention was made with U.S. Governmental sponsorship under Contract No. CHE-8810024 awarded by the National Science Foundation. The U.S. Government has certain rights in this invention.

BACKGROUND OF THE INVENTION

1. Field of the Invention

The present invention is directed to a new class of rigid rod and ladder benzobisazole polymers. The present invention is further directed to a process for making said polymers. The subject invention is still further directed to a process for producing light utilizing a rigid rod and ladder polymer. Finally, the subject invention encompasses light emitting devices utilizing rigid rod and ladder polymers of the class useful in the process of producing light.

2. Background of the Prior Art

Optoelectronics has rapidly grown in importance in recent years because of its impact on modern information processing systems and optical communication. The kinds of devices in which optoelectronics plays a major role includes light emitting diodes (LEDs) for displays, lasers, photo detectors, electrophotographic imaging, solar cells, waveguide switches, modulators and the like. Obviously, these types of devices are at the cutting edge of technology. The focus of the present invention lies on that area of optoelectronic technology which involves LEDs and other light emitting devices.

Light emitting diodes of the prior art were fabricated of inorganic semiconductors. Unfortunately, inorganic semiconductor optoelectronic materials, although useful in producing LEDs, have major shortcomings. These inorganic semiconductors, which usually are made of alloys of elements of Groups III and V of the Periodic Table of the Elements, are very high cost materials which are not easily processed into optoelectronic materials. Indeed, these inorganic semiconductor materials are incompatible with each other. Another shortcoming of an LED fantricated of an inorganic material is its failure to provide a wide spectral range. Thus, multicolor emitters for full color flat-paneled displays, essential for applications such as computer and television screens, is precluded. Even a known exception to this rule, the inorganic semiconductor material $LiNbO_3$ which is not subject to this limitation, cannot be used in an LED. $LiNbO_3$, as well as other related materials which do not suffer from the problem associated with narrow spectral range, does not emit light.

Because of the failings of inorganic semiconductor materials in optoelectronic devices, focus has shifted to organic materials. Thus, significant research has been invested in the development of electrically conducting polymers. Such activity has been accelerated with the development of polymer doping. However, up to the present time, the only polymer which has found commercial acceptance as a conducting polymer is polyaniline. Polyaniline is utilized as an electrode material in batteries.

The development of conducting polymers has led to the investigation of polymers for utilization in this application. Of particular interest are the so-called conjugated rigid-rod and ladder polymers. These polymers are mentioned in the prior art as electronic, photoelectronic and non-linear optical materials. A plurality of applications and patents have issued disclosing such polymers. None of these references, however, have identified such polymers as light emitting devices or their suitability as a light emitting source in an LED.

A plurality of U.S. patents have issued to Wolfe and others which describe the synthesis, characterization and fabrication of extended chain or rod-like polymers. Among these disclosures is U.S. Pat. No. 4,225,700 which is directed to the specific polymer, poly((benzo(1,2-d:4,5-d')-bisthiazole-2,6-diyl)1,4-phenylene) (PBT). The '700 patent, moreover, sets forth another extended chain polymer, poly((benzo(1,2-d:5,4-d')bisoxazole-2,4-diyl)-1,4-phenylene) (PBO). The polybenzobisthiazoles claimed in the '700 patent are employed in the formation of liquid crystalline solution compositions in which the solute polymer is present in a concentration of no more than 10% by weight. Other disclosures by Wolfe et al. of related polymers in this class include U.S. Pat. Nos. 4,533,692; 4,533,724; 4,703,103; 4,772,678.

The article, Wolfe et al., *Macromolecules*, 14, 915–920 (1981) sets forth the synthesis of PBO, disclosed as prior art in the aforementioned '700 patent. The synthesis of the compound claimed in the '700 patent, PBT, is set forth in the article, Wolfe et al., *Macromolecules*, 14, 915–920 (1981). The aforementioned PBT polymer is investigated in terms of its third-order non-linear optical properties in Vanherzeele et al., *Appl. Phys. Lett.*, 58, 663–665. It is noted that in this paper PBT is denoted as PBZT. Rao et al., *Appl. Phys. Lett.*, 48, 1187–1189 (1986) discusses the third-order non-linear optical susceptibility of PBT.

Additional papers which employ PBT, including solubilization, complexation and vibrational spectroscopic characterization of PBT and related polymers, are presented in Jenekhe et al., *Macromolecules*, 22, 3216–3222 (1989); Jenekhe et al., *Macromolecules*, 23, 4419–4429 (1990); and Shen et al., *Polymer*, 23, 969–973 (1982).

Yokoyama et al., *Chem. Lett. Chem. Soc. Jap.*, 779–782 (1990) describes the synthesis of ultrathin films of poly (vinylene benzothiazole) (PVBT) which are recited to have potential as electronic and optical devices. A later disclosure, Oshaheni et al., *Proc. ACS. Div. Pol. Mat.: Sci. and Eng.*, 67, 474–475 (1992) (Query: When was this paper published?) indicates that the polymer synthesized by Yokoyama et al. was not PVBT. The Osaheni et al. paper describes the preparation of four conjugated polybenzobisthiazoles: poly-benzobisthiazole (PBBT), poly(benzobisthiazole vinylene) (PBVT), poly(phenylene benzobisthiazole) (PBZT) and poly(benzobisthiazole divinylene) (PBTDV). It is appreciated that the synthesis of PBZT was well known in the art at the time of its synthesis by Osaheni et al.

The above extensive discussion emphasizes the developing interest in conjugated rigid-rod polymers, especially benzobisthiazole polymers. However, nothing in the art directed to rigid-rod polymers suggests their employment in light emitting diodes and other light emitting devices. This is not to say that such devices employing organic electroluminescence agents were not known in the art. U.S. Pat. No. 5,142,343 to Hosokawa et al. is directed to organic electroluminescence devices which comprise an organic semiconductor zone and an organic insulator zone sandwiched between electrodes. The organic insulator zone comprises an organic light emitting area and the organic semiconductor zone includes an electroconducting oligomer. The electroconducting material is preferably a thiothene-containing oligomer. The critical light emitting area, the organic insulator zone, is a polycyclic condensation aromatic compound. These compounds, structurally distinguished from the rigid-rod polymers discussed above, are further differentiated in that they are compounds rather than polymers.

SUMMARY OF THE INVENTION

The present invention is directed to a new class of polymers which are employable in light emitting devices, particularly a light emitting diode (LED). In addition to the new polymers of the present invention other rigid rod and ladder polymers, structurally dissimilar from the polymers of the present invention, are also employable in this application and their use in a process of emitting lights is an aspect of the present application.

The common characteristic of all the polymers within the contemplation of the present invention is the improvement they impart to light emitting devices compared to the materials employed in light emitting devices of the prior art. Thus, the high cost of inorganic semiconductor materials employed in the LEDs of the prior art is significantly reduced by the lower cost rigid rod and ladder polymers within the contemplation of the present invention. Moreover, the polymers within the contemplation of the present invention are easily formed into polymeric films and are readily processable into light emitting devices. The inorganic semiconductor materials of the prior art are difficultly processable into such devices.

The polymers formed into films in the present invention are useful in large scale light emitting devices/LEDs formed from the inorganic semiconductor materials of the prior art cannot be formed into large scale devices.

Finally, the structural strength of the rigid rod and ladder polymeric films, useful in the light emitting devices of the present invention, greatly exceeds not only the inorganic semiconductor materials of the prior art but also the organic materials, other than rigid rid and ladder polymers, proposed for use in this application. As stated above, the organic materials useful in light emitting devices in the prior art are not polymeric and are thus characterized by lower strength characteristics. As such, their durability and long term effectiveness is questionable.

In accordance with the present invention, a new class of polymers is provided. The polymers within the contemplation of the present invention include homopolymers having the repeating structural unit

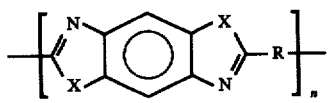

where X is the same or different and is sulfur, oxygen or —NR¹; R is

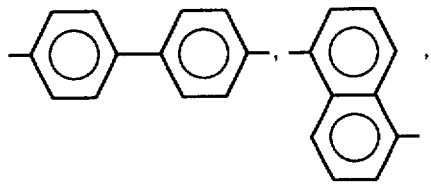

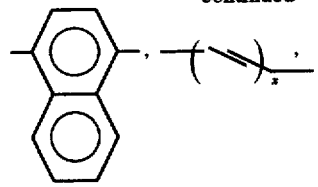

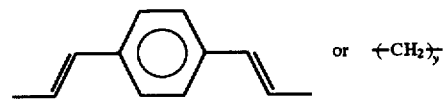

when X is the same or different and is sulfur or oxygen, however, R is nil,

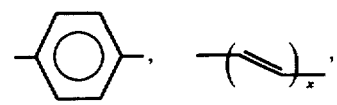

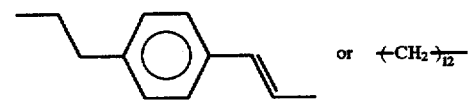

when X is —NR¹; R¹ is hydrogen or hydrocarbyl; x is 1 or 2; y is an integer of 8 to 11; z is 1 or 2; and n is an integer of 2 to 2,000.

Another class of rigid rod and ladder polymers within the contemplation of the present invention is characterized by the repeating structural unit

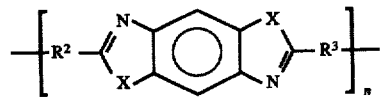

where X, R¹ and n have the meanings given above; R² is

when R³ is

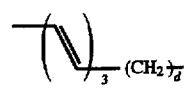

however, R₂ is

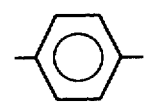

when R³ is

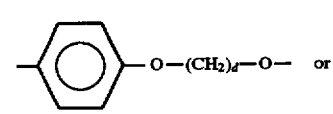 or

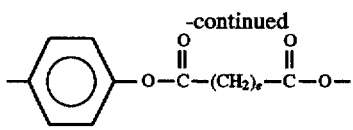

d is an integer of 1 to 5; e is an integer of 1 to 18; and f is an integer of 1 to 18.

Yet another class of rigid rod and ladder polymers encompassed by the present invention is a polymer having the repeating structural unit

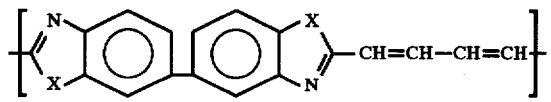

where X and n have the meanings given above.

The present invention is not limited to homopolymers of the repeating structural units recited hereinabove. Copolymers of at least two repeating structural units within the scope of one or more of the above generic repeating structural units are within the contemplation of the present invention.

In further accordance with the present invention a process for making the above new polymers is set forth. In that process a polymer having the repeating structural unit

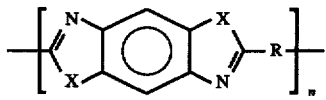

is synthesized by dehydrohalogenating a compound having the structural formula

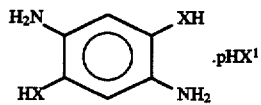

where X has the meanings given above; $X^1$ is chlorine or bromine; p is 2 when X is oxygen or sulfur; and p is 4 when X is —$NR^1$. The dehydrohalogenation step is followed by reaction with HOOC—R—COOH, where R has the meanings given above.

The process to produce a polymer having the repeating structural unit

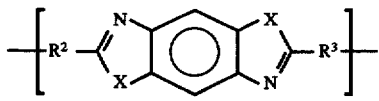

is identical to the presses employed to produce the polymer which includes the previous repeating structural unit. The only distinction is the replacement of the compound HOOC—R—COOH with the compound HOOC—$R^2$—$R^3$—COOH.

The process to produce a polymer having the repeating structural unit

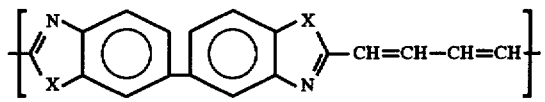

is prepared by dehydrohalogenating compound having the structural formula:

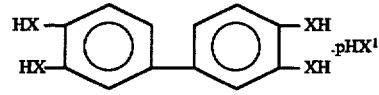

where X is sulfur, —$NR^1$ or oxygen; $R^1$ is hydrogen or hydrocarbyl; and p is an integer of 2 or 4. This step is followed by contact with trans, trans nuconic acid.

The process to produce copolymers which comprise two or more repeating structural formulae of the homopolymers given above involve the simultaneous processing of two or more monomers which result in the polymerization of the polymers having the repeating structural units recited above.

In further accordance with the present invention, a process for producing light is provided. This process includes the steps of imposing a source of energy upon a polymeric film, the film being a homopolymer of one or a copolymer of at least two polymers having the repeating structural unit selected from the group consisting of

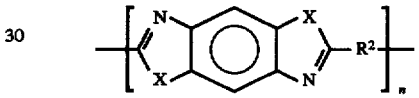

where $R^2$ is nil;

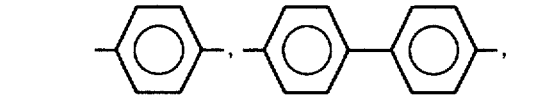

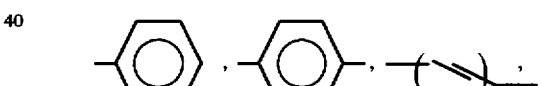

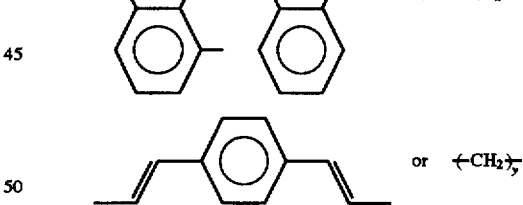

when X is sulfur or oxygen;
$R^2$ is nil

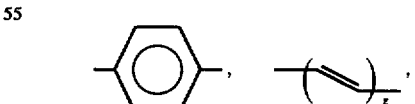

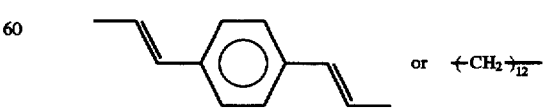

when
X is —$NR^1$; $R^1$ is hydrogen; x is 1 or 2; y is an integer of 8 to 11; z is 1 or 2; and n has the meaning given above,

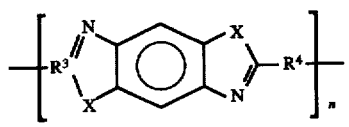

where $R^3$ is

when $R^4$ is

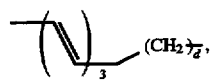

$R^3$ is

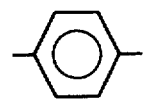

when $R^7$ is

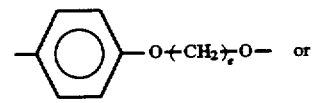

d is an integer of 1 to 5; e is an integer of 1 to 18; f is an integer of 1 to 18; and X, $R^1$ and n have the meanings given above,

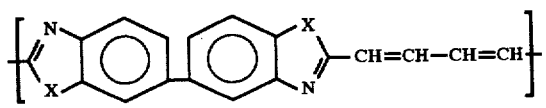

where X, $R^1$ and n have the meanings given above,

where m is an integer of 2 to 2000; w is o, or integer of 1 to 18; and x, $R^1$ and n have the meanings given above,

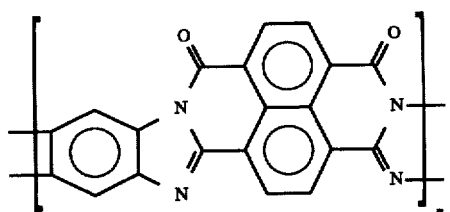

where n has the meaning given above and

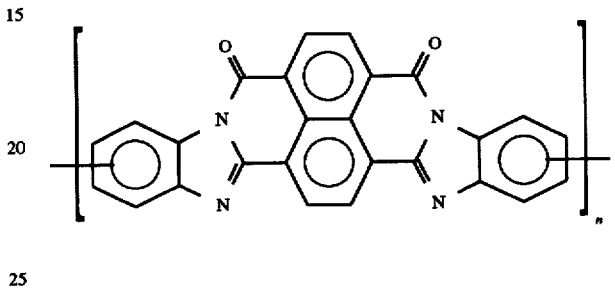

where n has the meaning given above.

In yet further accordance with the process of producing light by imposing a source of energy upon a polymeric film of the present invention, the film may be additionally a homopolymer of one or a copolymer of two or more monomers having the repeating structural units described below. In addition, the copolymer may include in addition to one or more of the following structural units one or more repeating structural units within the contemplation of the polymers recited above directed to the process of producing light mentioned above. These additional polymeric repeating structural units are as follows:

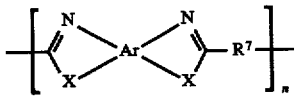

where Ar is

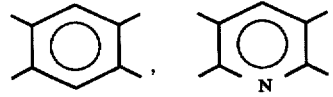

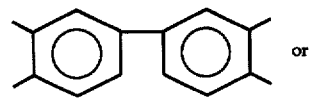

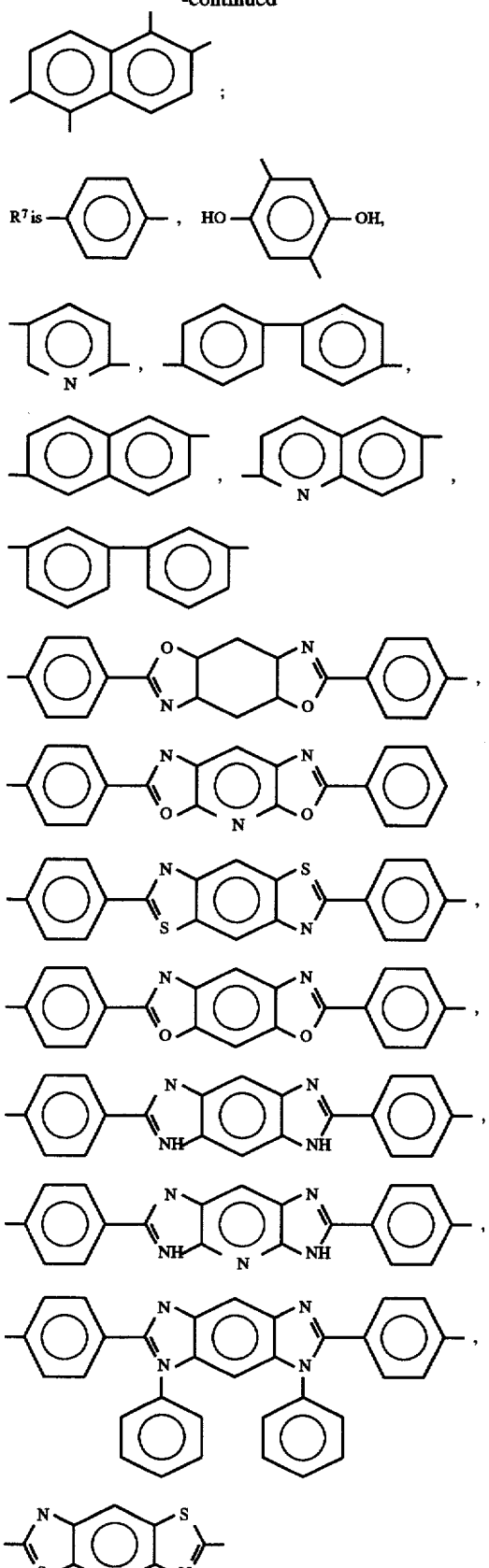
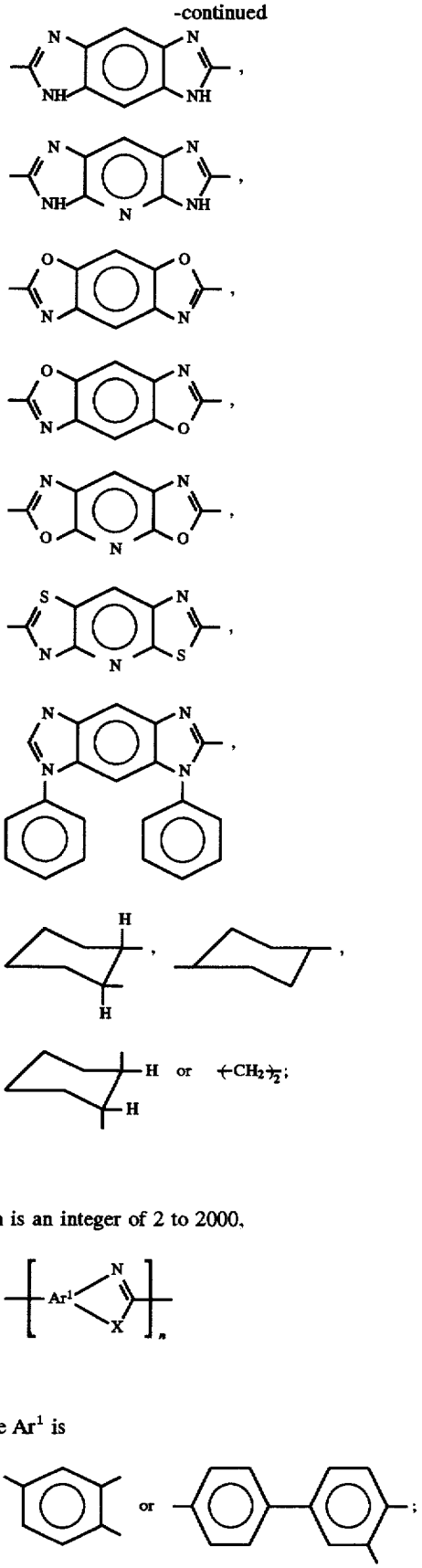
and n is an integer of 2 to 2000,
where $Ar^1$ is and X, R¹ and n have the meanings given above,

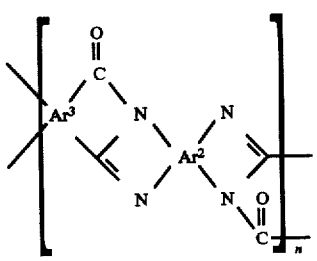

where Ar² is

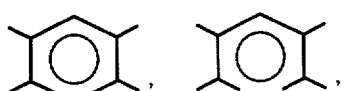

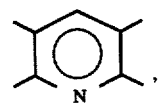

;

Ar³ is

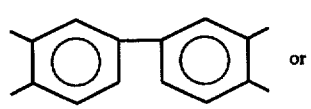

;

and n has the meanings given above,

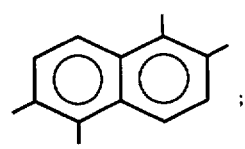

where Ar⁴ is

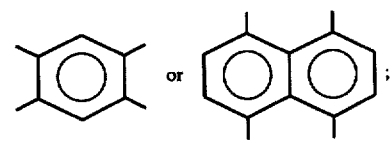

or

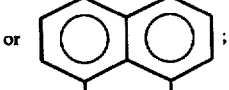

;

and Ar, X, R¹ and n have the meanings given above,

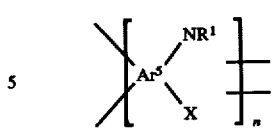

where Ar⁵ is

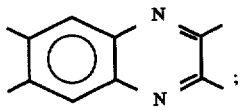

;

and X, R¹ and n have the meanings given above,

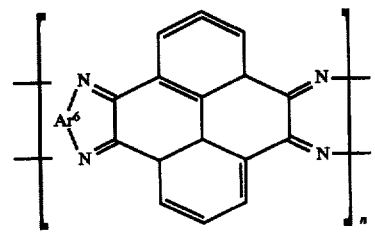

Ar⁶ is

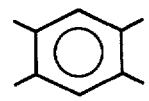 , 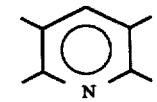 or

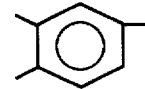 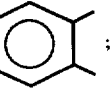 ;

and
n has the meaning given above and

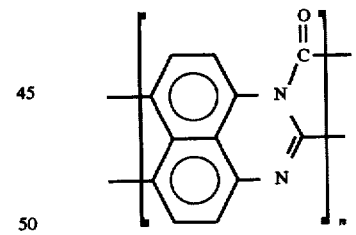

where n has the meaning given above.

In still further accordance with the present invention a light emitting diode is taught. The light emitting diode comprises a polymeric film of a homopolymer having a repeating structural unit of any of the homopolymers within the contemplation of the process of producing light of the present invention. Alternately, the polymeric film is a copolymer of two or more repeating structural units within the contemplation of the process of producing light of the present invention. The polymeric film of the light emitting diode is in electrical communication with electrodes which, in turn, are in electrical communication with a voltage source.

BRIEF DESCRIPTION OF THE DRAWINGS

The invention may be better understood with reference to the drawings of which.

DETAILED DESCRIPTION

Figure 1:
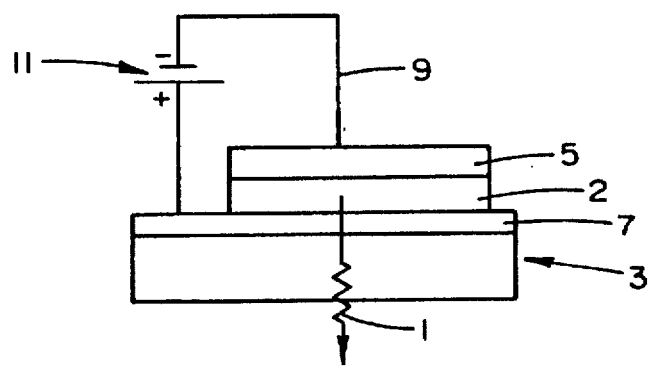
FIGS. 1 to 6 are schematic representations of light emitting diodes of transverse geometry of the present invention.

Polymers within the contemplation of the present invention include those homopolymers having the repeating structural unit

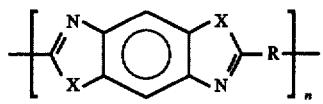
(I)

where X is the same or different and is sulfur, oxygen or $NR^1$; n is an integer of 2 to 2000; R is

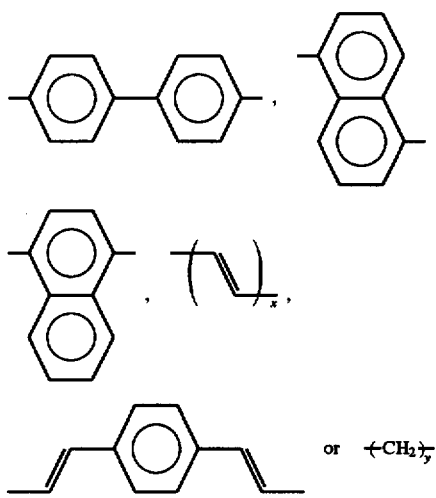

when X is sulfur or oxygen; or R is nil,

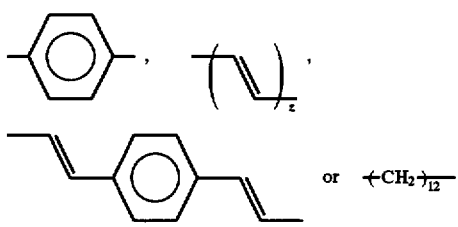

when X is $NR^1$; $R^1$ is hydrogen or hydrocarbyl; X is 1 or 2; y is an integer of 8 to 11; and z is 1 or 2;

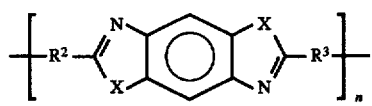
(II)

where $R^2$ is

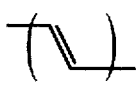

when $R^3$ is

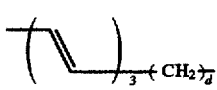

or $R^2$ is

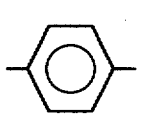

when $R^3$ is

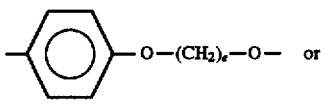

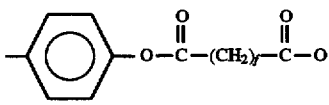

d is an integer of 1 to 5; e is an integer of 1 to 18; f is an integer of 1 to 18; and X, $R^1$ and n have the meanings given above; and

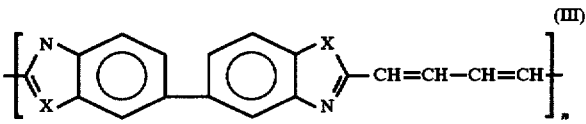
(III)

where X, $R^1$ and n have the meanings given above.

In addition to the above homopolymers copolymers comprising a repeating structural unit which includes at least two species with the contemplation of one or more of structural formulae I to III are within the scope of this invention. Further, copolymers which include at least one repeating structural unit of formulae I to III and at least one structural unit of structural formulae VIII to XXII are polymers of the present invention.

Among the copolymers within the scope of the present invention a preferred copolymer is one having the repeating structural unit

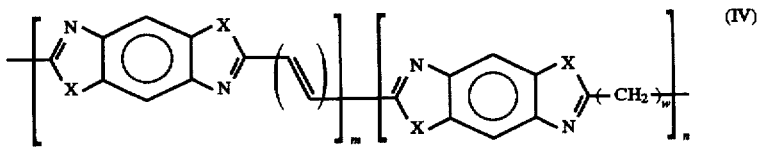 (IV)

where w is 0 or an integer of 1 to 18; m is an integer of 2 to 2,000; and X, $R^1$ and n have the meanings given above.

Preferred homopolymers are those having a repeating structural unit within the contemplation of any of formulae I to III where X is sulfur or —$NR^1$; and n is an integer of 10 to 600.

Still more preferred homopolymers are those having a repeating structural unit having a formula of any one of I, II or III where X is sulfur or —NH; and n is 20 to 200.

Preferred copolymers and more preferred copolymers include at least one repeating structural unit within the contemplation of the preferred and more preferred homopolymers of the subject invention.

Another aspect of the subject invention is the manufacture of the homopolymers and copolymers of the present invention. In this aspect of the present invention a homopolymer or copolymer which includes the repeating structural unit having the formula I is prepared by dissolving a compound having the structural formula

 (V)

where X has the meanings given above; and p is integer of 2 when X is sulfur or oxygen; and p is 4 when X is $NR^1$, preferably in polyphosphoric acid (PPA). The solution is dehydrochlorinated product is thereupon contacted with a compound having the structural formula

COOH—R—COOH (VI)

where R has the meanings given above. To compensate for the water of condensation lost in the heating of the compound V additional phosphorus pentoxide ($P_2O_5$) is added. The product is heated for an extended period of time and thereafter copied. The polymeric product is obtained by precipitation in water and purified by extracting the PPA with water.

In a preferred embodiment of this aspect of the present invention the process of producing a polymer which includes the repeating structural unit of Formula I, a compound selected from the group consisting of 1,2,4,5-tetraaminobenzenetetrahydrochloride, 1,4-diamino-2,5-dithiobenzenedihydrochloride and 1,4-diamino-2,5-diolbenzenedihydrochloride is dehydrochlorinated by first being dissolved in a 70% to 80% deaerated PPA.

A particularly preferred embodiment of this process involved the use of 77% deaerated PPA, formed from 100% PPA and 85% phosphoric acid, which dissolves 1,2,4,5-tetraminobenzenetetrahydrochloride or 1,4-diamino-2,5-dithtobenzenedihydrochloride. Preferred species of compound VI include fumetic acid, oxalic acid and trans-, trans-muconic acid.

To produce polymers which include the repeating structural unit II, the process to produce the polymer having repeating structural unit I is repeated but for the replacement of compound VI with

COOH—$R^2$—$R^3$—COOH.

The synthesis of polymers which include the repeating structural unit III is accomplished by dehydrochloinating a compound having the structural formula

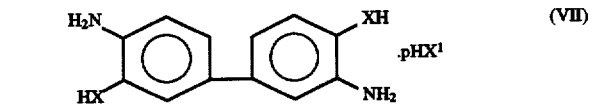 (VII)

where X has the meanings given above, in the presence of PPA followed by reacting the dehydrochlorinated product with trans,trans muconic acid.

Preferably, the PPA utilized in the synthesis of the polymer having the structural formula III is between 80 and 90 weight % PPA and the compound having the structural formula VII is 3,3'-diaminobenzidine.

The present invention also contemplates a process for producing light wherein a source of energy is imposed upon a polymeric film. The polymeric film may be a film of a homopolymer of any of the polymers having a repeating structural unit within the contemplation of any of formulae (I) to (III). Moreover, the polymeric film may be a film of a copolymer having a repeating structural unit encompassing two or more repeating structural units of one or more of formulae I to III.

In addition to films of the above discussed polymers, polymers known in the art but not disclosed as useful in a process for producing light upon the imposition of an energy source are within the contemplation of the process of this invention. These polymers, the repeating structural units of which are within the scope of those set forth below, may be homopolymers of any one repeating structural unit mentioned hereinafter or copolymers of two or more of specific repeating structural units within the scope of one or more structural units described below.

Because of the greater scope of polymers within the scope of those useful in the formation of polymeric films employed in the process of producing light of the present invention than polymers within the contemplation of this invention, the polymers having the structural units below those within the scope of the polymeric films useful in the process of the subject invention; include those within the scope of the polymers of this invention. The polymers within the scope of the process of producing light then are as follows:

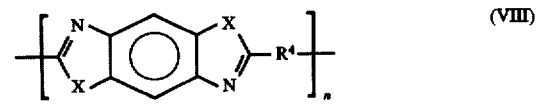 (VIII)

where X is the same or different as is sulfur, —$NR^1$ or oxygen; $R^4$ is nil,

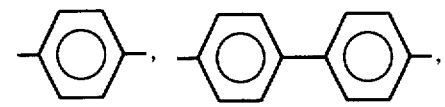

-continued

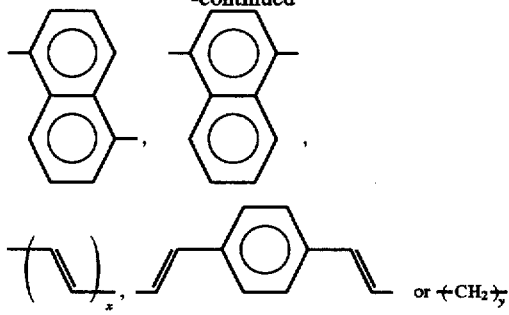

when X is sulfur or oxygen;
X is 1 or 2; $R^4$ is nil,

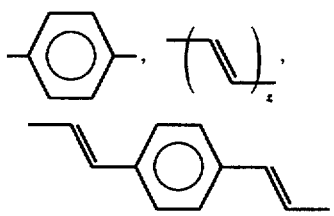

or $(CH_2)_{12}$ when X is $-NR^1$, $R^1$ is hydrogen or hydrocarbyl; X is 1 or 2; y is an integer of 8 to 11; z is 1 or 2; and n is an integer of 3 to 2,000.

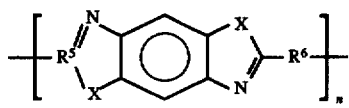

where $R^5$ is

when $R^6$ is

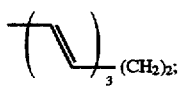

or $R^5$ is

when $R^6$ is

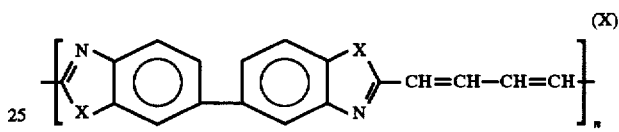

d is an integer of 1 to 5; e is an integer of 1 to 18; f is an integer of 1 to 18; and $R^1$ and n have the meanings given above.

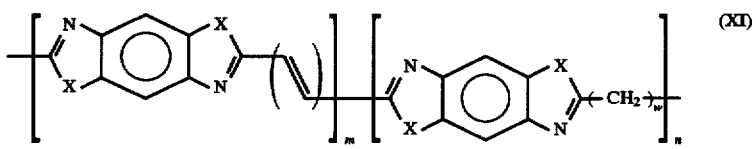

where X, $R^1$ and n have the meanings given above,

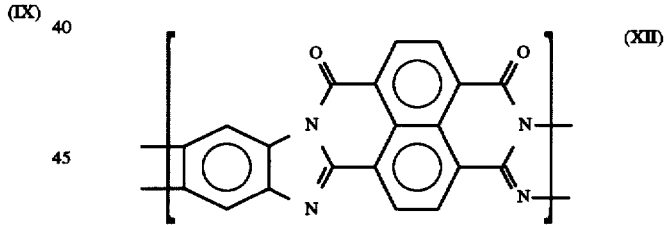

where m is an integer of 2 to 2,000; w is 0 or an integer of 1 to 18; and X, $R^1$ and n have the meanings given above.

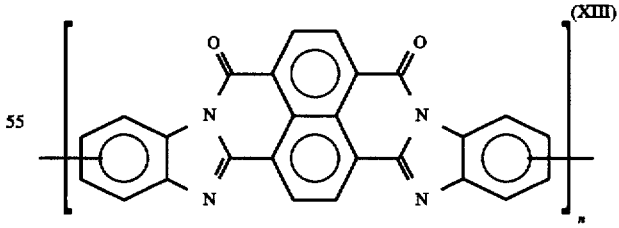

where n has the meaning given above.

In a preferred embodiment of the process of producing light the polymeric films which a repeating structural unit within the scope of the polymer having structural formulae VIII to XI are characterized by X being sulfur or $-NR^1$. In addition, $R^1$ is still more preferably hydrogen.

All the polymers of the films within the contemplation of this aspect of the present invention having one or more of structural formulae VIII to XIII are more preferably characterized by the repeating structural units being defined by n being 10 to 600. Still more preferably, n is 20 to 200.

In addition to embodiments in which the polymeric film used in the process of the present invention includes at least one repeating structural unit within the contemplation of formulae VIII to XIII, the polymeric film used in the process of producing light within the scope of this process include homopolymers of one repeating structural unit within the contemplation of repeating structural formulae XIV TO XXI below, copolymers of at least two of repeating structural formulae XIV to XXI and copolymers of at least one of the repeating structural units of formula XIV to XXI and at least one repeating structural unit within the contemplation of formulae VIII to XIV. These repeating structural units are:

$$\left[\begin{array}{c}N\diagdown\diagup N\\X\diagup Ar\diagdown X\end{array} R^7\right]_n$$ (XIV)

where Ar is

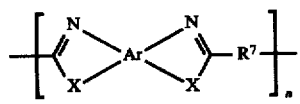,
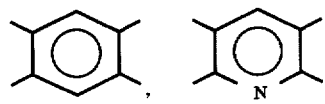,

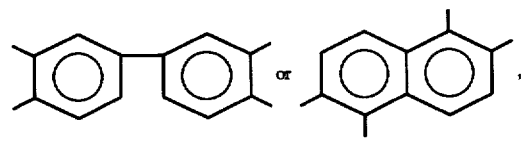 or $R^7$ is

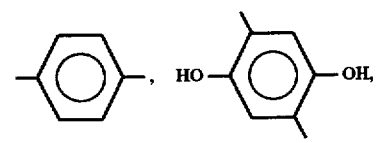, HO—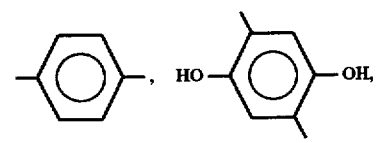—OH,

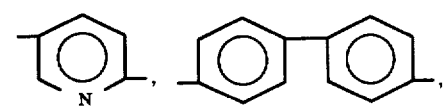, 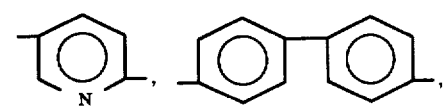,

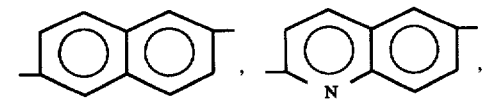, 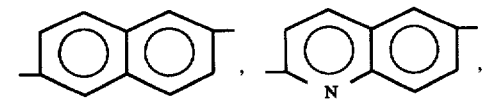,

,

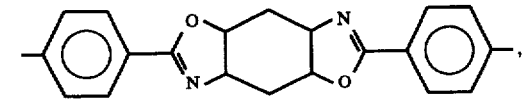,

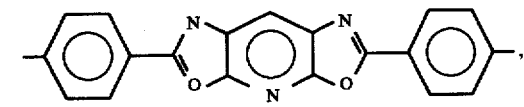,

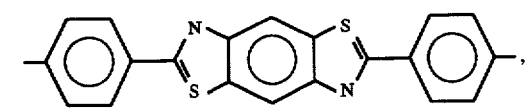,

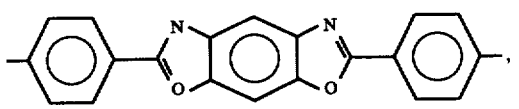,

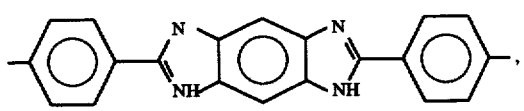,

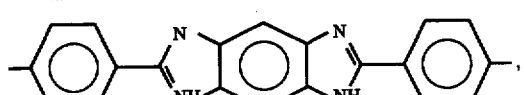,

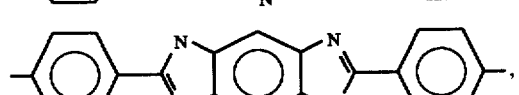,

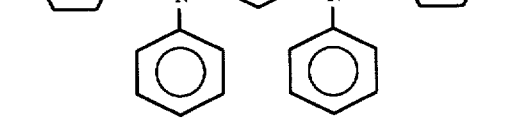,

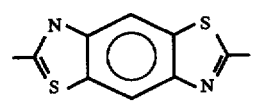,

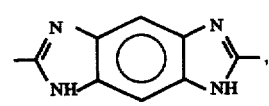,

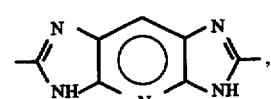,

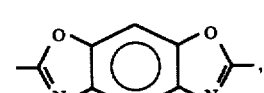,

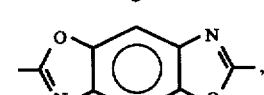,

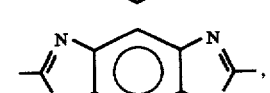,

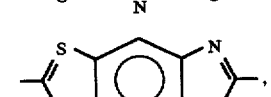,

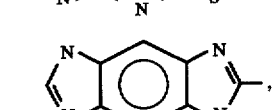,

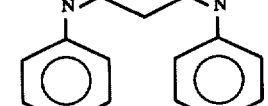,

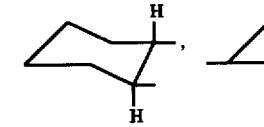,

-continued
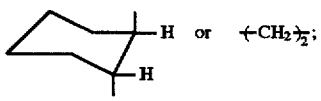
and n is an integer of 2 to 2000,
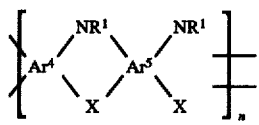
where Ar⁴ is
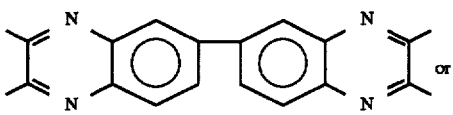
and Ar, X, R¹ and n have the meanings given above,
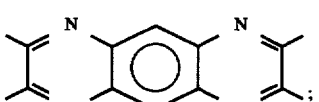
where Ar⁵ is
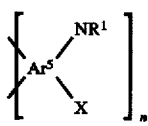
and X, R¹ and n have the meanings given above,
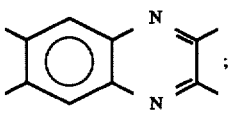 (XVII)
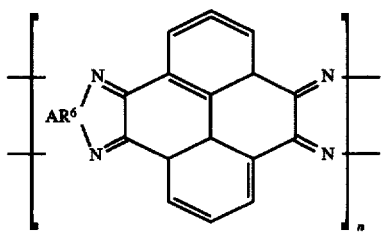
Ar⁶ is
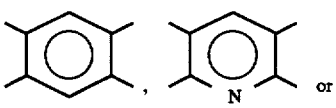
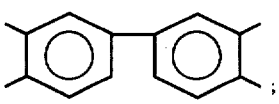
and
n has the meaning given above,
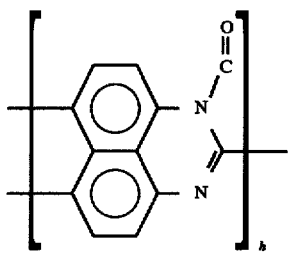 (XV)
have the meanings given above,
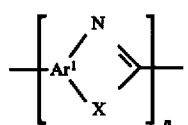 (XVIII)
where Ar¹ is
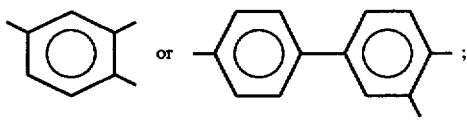
and X, R¹ and n have the meanings given above
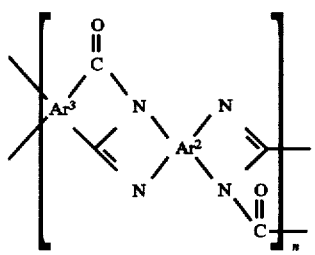 (XIX)
where Ar² is
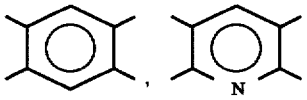
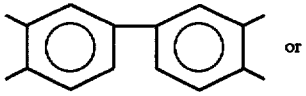
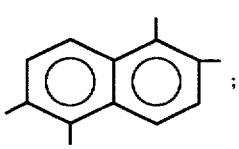
Ar³ is
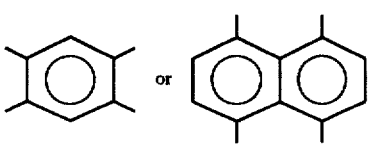
and n has the meanings given above, where Ar, X, $R^1$ and n have the meanings given above and

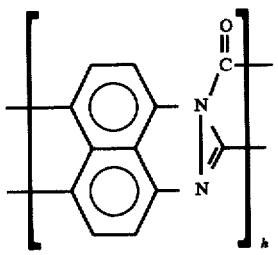

(XX)

where n has the meaning given above.

Preferably, the repeating structural units defined by structural formulae XIV, XV, XXI, and XVIII are characterized X being sulfur or $-NR^1$ and n being 10 to 600. Still more preferably, structural formulae XIV, XV, XVI, XVIII are defined by X being sulfur or —NH and n being 20 to 200. The latter meaning of n applies to the repeating structural unit of formula XX.

More preferably, n is 20 to 200 in structural formulae XIV to XX.

The process of producing light by imposing a source of energy upon a polymeric film is moreover preferably characterized by the source of energy provided by a voltage source.

Another aspect of the present invention is a light emitting diode. The light emitting diode includes a polymeric film formed from a homopolymer or a copolymer characterized by one or more, respectively, repeating structural units within the scope of one or more repeating structural units of formulae VIII to XX. The polymeric film of the light emitting diode is in electrical communication with positive and negative electrodes (anode and cathode respectively) which, in turn, are in electric communication with a voltage source.

Although all of the above described elements are required of the light emitting diode of the present invention, additional components and features may be provided. For example, the film may be disposed upon a substrate which may or not be ion-implanted. Furthermore, a portion of the polymeric film may be ion implanted to provide a positive and/or negative charge therein. These features will become readily understandable upon an analysis of specific embodiments of light emitting diodes within the contemplation of the present invention.

Prior to this discussion it is important to emphasize that light emitting diodes within the contemplation of this invention include an LED of transverse geometry and an LED of longitudinal geometry. A polymeric LED of transverse geometry provides vertical surface light emission. A polymeric LED of longitudinal geometry provides edge light emission.

With this introduction, attention is focused initially upon LEDs of transverse geometry. Six embodiments of LEDs of transverse geometry are preferred for use in the present invention.

Turning to the first such design, illustrated in FIG. 1, that diode includes a polymeric film of a polymer within the contemplation of the light emitting device of the present invention having at least one repeating structural unit within the contemplation of formulae VIII to XXII. That film, denoted by reference numeral 2, is disposed upon a substrate 3. A layer of substrate 3, in contact with the film 2, is ionically implanted to provide a positive electrode, that is, an anode identified at 7. As in all light emitting diodes within the contemplation of the present invention, a second, negatively charged electrode, the cathode, denoted at 5, is also included. The cathode 5, like the anode 7, is in electrical communication with the polymeric film 2. The cathode 5 in the LED of FIG. 1 is a metal electrode. Both electrodes 5 and 7 are in electrical communication, through electrical conduit 9, to a voltage source 11. Upon imposition of a electrical charge, the polymeric film emits light through a vertical surface, in this case light emission occurs through the substrate, side as indicated in FIG. 1 by the arrow 1.

Figure 2:
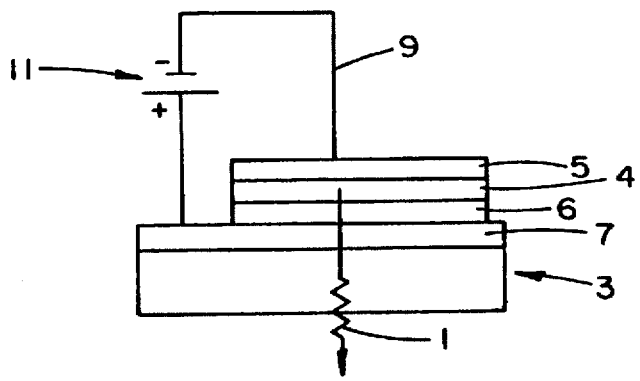

It is emphasized that the light emitting device of this invention may include more than one polymeric film layers. Thus, the light emitting device of FIG. 2 depicts is another preferred embodiment of the LED of this invention. The light emitting diode of FIG. 2 is identical to the LED of FIG. 1 but for the inclusion of a laminate of two polymeric films, denoted by film layers 4 and 6, rather than the single layer polymeric film 2 of the light emitting device of FIG. 1.

It is noted that the light emitting devices of FIGS. 1 and 2 employ a cathode 5 which covers the complete surface of the polymeric film. A more modestly sized electrode, which does not cover the full surface of the polymeric film, can also be utilized. In this preferred LED embodiment, however, the surface of the film in contact with the electrode is ion-implanted to provide a positive or negative charge. Such an LED is provided in FIG. 3.

Figure 3:
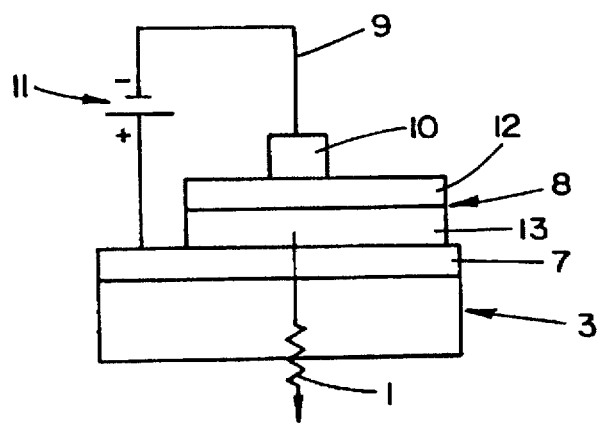

The light emitting diode of FIG. 3 is similar to the light emitting diode of FIG. 1. Thus, the anode is again provided by the same p-type doped portion 7 of the same substrate 3 as FIG. 1. The anode 7 is in electrical communication with a similar voltage source 11 by means of similar electrical conduit 9. However, the polymeric film of the LED of FIG. 3, identified by 8, includes an n-type ion implant layer 12 in electrical communication with a metal cathode 10. The cathode 10 is in electrical communication, again by means of electrical conduit 9, to a voltage source 11. The polymeric film 8 also includes a non-ion implanted layer 13. The LED of FIG. 3 also emits light through a vertical surface, again, as in the LEDs of FIGS. 1 and 2, through the substrate. This is depicted in FIG. 3 by the light designating arrow 1.

Figure 4:
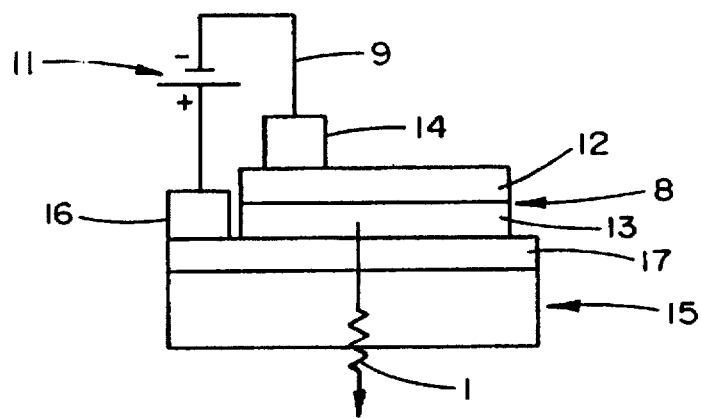

Yet another embodiment of the light emitting device of the present invention is depicted in FIG. 4. The light emitting diode of FIG. 4, like the light emitting diodes of FIGS. 1 to 3, is again a vertical surface light emitting diode of transverse geometry. The light emitting diode of FIG. 4 is similar to the light emitting diode of FIG. 3. However, although the polymeric film of the light emitting diode of FIG. 4 is similar to that of FIG. 3, in that they both include a polymeric film 4 which comprises a n-type ion implant layer 12 as well as an undoped layer 13, there are variations in the substrate and the metal electrode elements thereof.

Whereas the substrate 3 of the LED of FIG. 3 includes an electrode layer 7, the substrate of the LED of FIG. 4, denoted at 15, includes a p-type ion implant layer 17. This layer is not an anode in the sense that is electrode 7 of substrate 3. Instead, a metal anode 16 is provided in electrical communication with the p-type ion implant layer 17 of substrate 15.

Figure 5:
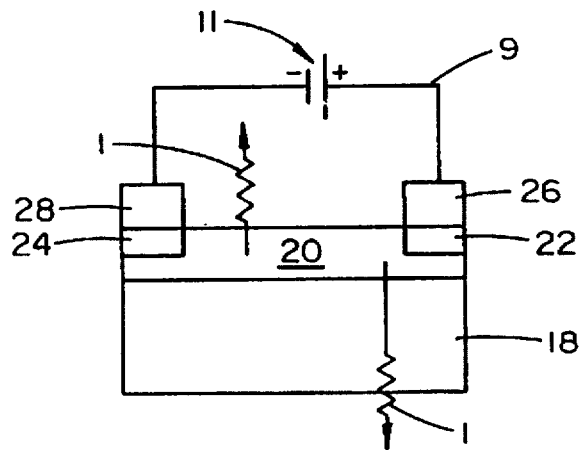

A further embodiment of the light emitting diode within the contemplation of the present invention is illustrated FIG. 5. The LED of FIG. 5 includes a polymeric film 20 which is doped with a p-type ion implant 22 and an n-type ion implant 24. These ion implant portions of polymeric film 20 are disposed immediately below a metal anode 26 and a metal cathode 28, respectively. These electrodes are in electrical communication, by means of an electrical conduit 9, to a voltage source 11. The polymeric film 20 is disposed on a implant free substrate 18. Light is emitted through the polymeric film as denoted by light arrow 1.

Figure 6:
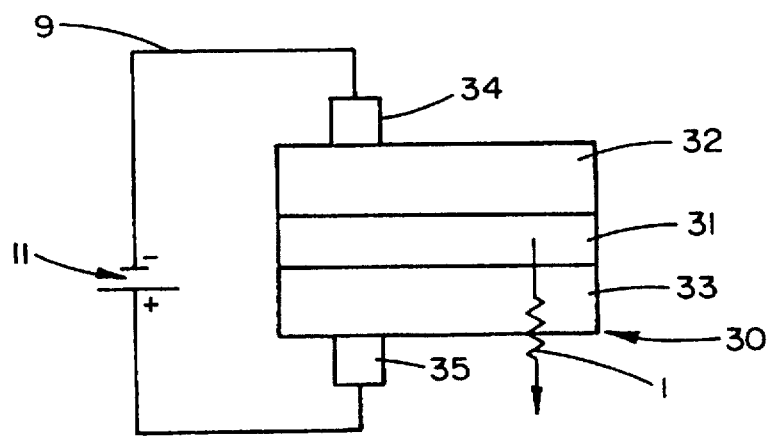

Yet a sixth embodiment of an LED of transverse geometry is depicted in FIG. 6. The LED of FIG. 6 includes a free-standing polymeric film 30 which includes an n-type ion implant layer 32 and a p-type ion implanted layer 33 sandwiching therebetween a non-doped film layer 31. A metal cathode 34 contacts the n-type ion implant layer 32 while a metal anode 35 is in contact with the p-type ion implant layer 33 of the polymeric film 30. As in the LEDs of FIGS. 1 to 5, the cathode 34 and the anode 35 are in electrical communication, by means of electrical conduit 9, with a voltage source 11. Light is emitted vertically through the substrate-free polymer as indicated by arrow 1.

In addition to the preferred light emitting diodes of transverse geometry of the present invention, illustrated by FIGS. 1 to 6, additional light emitting diodes of longitudinal geometry are within the contemplation of the present invention. These diodes are again polymeric LEDs. An LED of longitudinal geometry is distinguished from an LED of transverse geometry insofar as an LED of transverse geometry provides vertical surface light emission in contradistinction to an LED of longitudinal geometry which emits light through the edges of the film.

Figure 7:
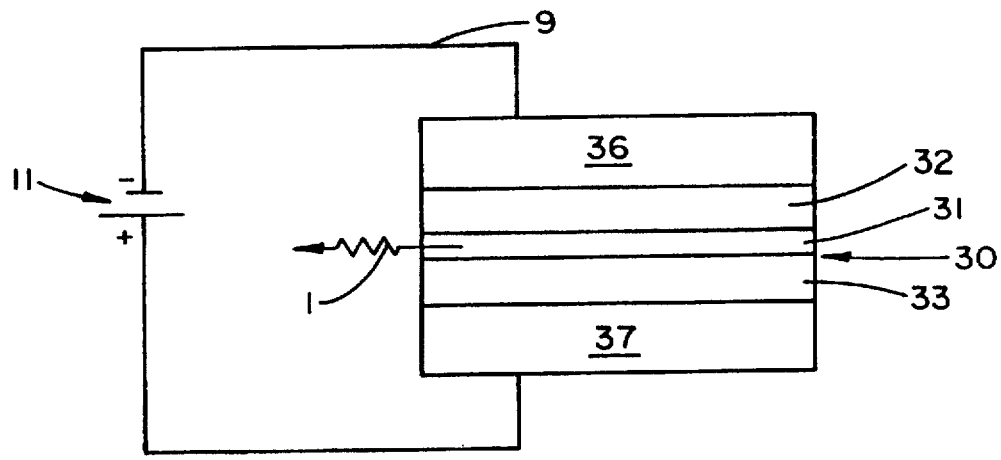
FIGS. 7 and 8 are schematic representations of light emitting devices of longitudinal geometry of the present invention.

To illustrate an LED of longitudinal geometry within the contemplation of the present invention, attention is directed to FIG. 7. The light emitting diode of FIG. 7 incorporates a polymeric film of similar design to that utilized in the light emitting device of FIG. 6. That is, the polymeric film, generally indicated at 30, includes an n-type ion implant layer 32 and a p-type ion implant layer 33 on the surfaces sandwiching therebetween a non-ion implant layer 31.

It is appreciated that reference numerals for the polymeric film of the LED of FIG. 7 are identical with the polymeric film of the LED of FIG. 6. This is because the two free-standing polymeric films of the LEDs of FIGS. 6 and 7 are identical. What distinguishes the LED of longitudinal geometry of FIG. 7 from the LED of transverse geometry of FIG. 6 is the size and disposition of the electrodes. Although both LEDs employ metal electrodes, the metal electrodes employed in the LED of FIG. 7 completely cover polymeric film 30 such that there is no optical transmission between that film and its surfaces. This is illustrated in the LED of FIG. 7 by the metal cathode 36, disposed above the n-type implant layer 32, and the metal anode 37, disposed below the p-type ion implant layer 33. As in the embodiments of LEDs of transverse geometry, the metal electrodes are in electrical communication with a voltage source 11 provided by means of electrical conduit 9. Because metal electrodes 36 and 37 block light transmission, light is emitted from the polymeric film 30 through its edges as indicated by the arrow 1. Obviously, the electrodes 34 and 35 of the LED of transverse geometry of FIG. 6 is not obstruct vertical light emission.

Figure 8:
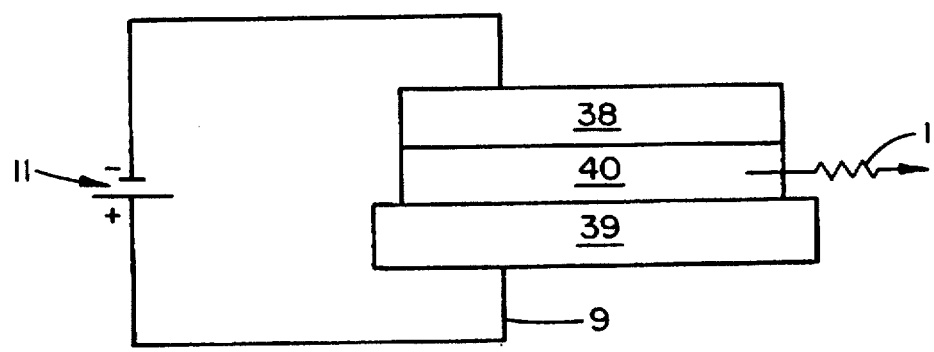

The final preferred embodiment depicted in the drawings is set forth in FIG. 8. FIG. 8 represents another preferred embodiment of an LED of longitudinal geometry of the present invention. As in the light emitting diode of FIG. 7, the light emitting diode of FIG. 8 encompasses a polymeric film whose principal surfaces are completely covered by metal electrodes. This is depicted in the light emitting diode of FIG. 8 by metal cathode 38 and metal anode 39. The device of FIG. 8 differs from the light emitting device of FIG. 7 in that the polymeric film 40 is undoped. That is, no ion implant layers are provided. Thus, the polymeric film 40 is completely surrounded by electrodes 38 and 39 which block vertical light transmission. As in the light emitting diode of FIG. 7, light is emitted through the polymeric film edges as denoted by the arrow 1.

The above description of light emitting diodes within the contemplation of the present invention emphasize several aspects of the subject invention. The first is that a critical component of the light emitting diode of the present invention is the polymeric film. Although other components of the light emitting diode are important in optimizing its effectiveness, it is the polymeric film which is the key component. Obviously, the light emitting diode of the present invention also requires an anode and a cathode in communication with the polymeric film and a voltage source in electrical communication with the electrodes.

The remaining components, although important, are not critical. One such important component is the substrate. A substrate, when included in the LED, is utilized as a support to deposit the polymeric film light emitting layer. Obviously, optical characteristics of the substrate material are important. Optical transparency of the substrate permits viewing of emitted light in a direction perpendicular to the plane of the light emitting polymeric film. However, optical transparency of the substrate is not essential. As those skilled in the art are aware, optical transparency is not required where an integrated optics or optical interconnection of electronic devices, where the emitted light is guided to a waveguide, is not employed. In such case, the refractive index of the substrate material must be significantly different from that of the polymer or the waveguide. Independent of its optical properties, the substrate should be rigid if employed in a flat panel display but must be flexible if used in a curved panel display.

As depicted in the drawings illustrating preferred light emitting diodes, the substrate may be provided with a conducting electrode surface. The conducting electrode surface is deposited upon the substrate. Among preferred conducting electrode surfaces deposited upon a substrate are metals, indium tin oxide, polyaniline, an ion implanted polymer of one of the polymers within the contemplation of those polymers useful as the polymeric film of the present invention and the like. It is emphasized that these materials, other than a metallic layer, are optically transparent permitting emitted light to pass therethrough. In the preferred embodiment wherein a metallic layer is utilized, the thickness of the layer is deliberated provided in a layer so thin that it is not light opaque, permitting emitted light to pass therethrough.

The substrate itself is preferably glass or a polymer. Particularly preferred polymers for use as the substrate are such transparent plastics as polycarbonate or poly (methylmethacrylate). These substrates are provided in the form of films.

As noted earlier, many of the polymeric films utilized in the light emitting diode of the present invention are ion implanted. The ion implanted films utilized in the light emitting device of the present invention are transparent in the visible range.

In regard to the ion implantation of the polymeric film, it has been surprisingly found that both n-type and p-type conductivity by means of ion implantation is obtainable. Ions of inert elements including helium, neon, argon, xenon and krypton may be ion implanted to provide either n-type or p-type ion implantation. Of these, argon, krypton and xenon are preferred, especially to provide an n-type ion implantation layer. The halogen elements, fluorine, chlorine, bromine and iodine are employable to provide ion implantation albeit only in forming a p-type ion implanted electrically conductive layer. Elements of the alkaline metals, lithium, sodium and potassium, are particularly preferred to provide an n-type ion implantation layer.

The metal cathode utilized in the devices of the present invention are preferably calcium, indium or aluminum. The metal of the anode is preferably gold or platinum. It is particularly preferred that the metal cathode be calcium and the metal anode be gold.

It is noted that ion implanted polymeric films require less film-metal electrode contact than non-ion implanted films. Thus, polymeric films which are free of ion implantation usually require complete surface contact with a metal electrode. On the other hand, smaller electrodes, providing much less contact with the polymeric surface, may be used where electrode contact is with an ion implant layer of the polymeric film.

The polymeric light emitting diodes of the present invention are preferably prepared by film extrusion, in the case of free standing films, or by spin coating the polymer onto a substrate, in the case of supported films. Spin coating involves coating a solution of the polymer, preferably in a nitroalkane/Lewis acid solvent. Polymeric films produced by spin coating typically have a thickness in the range of between about 20 nm to 5 microns and are not oriented. Extruded films, utilized in free standing films, are oriented and have a thickness in excess of one micron.

The electrodes, in electrical communication with the polymeric film, are metals of the type mentioned above which are preferably vacuum evaporated onto the surface of the polymeric film to which they are in electrical communication.

The following examples are given to illustrate the scope of the present invention. Because these examples are given for illustrative purposes only, the invention should not be deemed limited thereto.

EXAMPLE 1

Preparation of Polybenzobisimidazole 1,2,4,5-Tetraminobenzene tetrahydrochloride (TABH) (4.0 g, 14.18 mmol) was dissolved in 77% polyphosphoric acid (PPA) (12 g). The 77% PPA was prepared by combining polyphosphoric acid and 85% phosphoric acid. The thus formed solution of TABH in PPA was placed in a glass reactor fitted with a mechanical stirrer, two gas ports and a side arm. The reaction vessel was purged with nitrogen for 20 minutes and thereupon maintained at a temperature of 80° C. under vacuum for 24 hours. After this treatment, complete dehydrochlorination occurred and the reaction mixture was cooled to 50° C. under a nitrogen atmosphere.

Oxalic acid (1.277 g, 14.18) and phosphorus pentoxide ($P_2O_5$) (8 g), the $P_2O_5$ to compensate for the calculated water of condensation, was added to the dehydrochlorinated product. The reaction temperature was raised to 120° C. and held at this temperature for 10 hours. The reaction temperature was thereupon raised to 140° C. and finally to a range of 180° to 200° C. The reaction was allowed to proceed in this elevated temperature range of 180° to 200° C. for 36 hours.

The resultant product, a polymerization dope in PPA, blue-green in color, was cooled to room temperature and precipitated in water. The product was thereupon purified by extraction of the PPA with water for three days.

The thus prepared product, polybenzobisthiazole (PBBI), was characterized by Fourier Transfer Infrared (FTIR) as follows:

FTIR (KBr pellet, $cm^{-1}$) 3408, 3010, 1616, 1512, 1447, 1356, 1256, 1179, 1139, 1069, 841.

EXAMPLE 2

Preparation of Poly(benzobisimidazole Vinylene)

TABH (5.2 g 18.3 mmol) was dehydrochlorinated in deaerated 77% (PPA) (16.5 g) in accordance with the procedure utilized in Example 1. Upon complete dehydrochlorination, and under the conditions present in Example 1, fumaric acid (2.125 g, 18.3 mmol) and $P_2O_5$ (12.2 g) were added. The temperature was gradually raised to 120° C. over six hours and then to 160° C. and finally to 180° C. This polymerization mixture, which became yellowish-brown in color, was allowed to proceed at 180° C. for 24 hours. The polymeric dope mixture was then precipitated in water. The precipitated polymer was purified by extraction in water for three days.

The polymeric product, poly(benzobisimidazole vinylene) (PBIV), was characterized as follows:

FTIR (KBr pellet, $cm^{-1}$) 3300, 3010, 1629, 1388, 1297, 1238, 1151, 1015, 960, 841, 669.

EXAMPLE 3

Preparation of Poly(benzobisimidazole Divinylene)

The dehydrochlorination reaction of TABH (2.2 g, 7.75 mmol) was repeated in accordance with the procedure utilized in Example 1. The cooled dehydrochlorination reaction product was reacted with trans,trans-muconic acid (1.1 g, 7.75 mmol) in accordance with the procedure utilized in Example 2. $P_2O_5$ added with the muconic acid in an amount to compensate for the water of condensation. The temperature of the thus formed reaction product was raised to 85° C. over two hours and held at this temperature for six hours. Thereupon, the reaction temperature was increased to 120° C. The viscosity of the reaction mixture rose rapidly with a corresponding color change from yellow to yellowish-green under the elevated 120° C. temperature. The reaction was allowed to proceed for 14 hours at 120° C. during which time the polymerization dope became stir opalescent. The polymerization dope was cooled to room temperature and precipitated in water. The fibrous polymer thus formed was shredded into small pieces with a blender to facilitate purification which was facilitated by extraction with water for 2 to 3 days.

The polymer product, poly(benzobisimidazole divinylene) (PBIDV), was characterized by Fourier Transfer Infrared (FTIR) and nuclear magnetic resonance (NMR). The characterizing data were as follows:

FTIR (free standing film, $cm^{-1}$) 3400, 3010, 1619, 1500, 1383, 1278, 1151, 1091, 984, 828;

$^1$H NMR ($CD_3NO_2/AlCl_3$, 300 MHz TMS) δ, ppm, 7.5 (d,2H); 8.0 (d,2H); 8.4 (d,2H); 9.1(s,2H).

EXAMPLE 4

Preparation of Poly(benzobisimidazole Divinylene)

3,3'-Diaminobenzidine (1.508 g, 7.04 mmol) was dehydrochlorinated with 83.3 wt % deaerated PPA in accordance with the procedure enumerated in Example 1. The product of this dehydrochlorination was reacted with trans,trans-muconic acid (1.0 g, 7.04 mmol) in accordance with the procedure of Example 1. This polymerization reaction was conducted for a total of 30 hours, the first 6 hours of which were at a temperature of 100° C. and the final 24 hours at 140° C. The product of this reaction was a yellowish-brown polymerization dope. This product was precipitated in water and purified by extraction, for 3 days, with water.

The product of this polymerization reaction, poly (benzobisimidazole divinylene) (PBBIDV), was characterized by Fourier Transfer Infrared (FTIR) and nuclear magnetic resonance (NMR). These characterizations are as follows:

FTIR (KBr pellet, cm$^{-1}$) 3400, 3010, 1627, 1504, 1458, 1287, 1249, 1081, 995, 881;

$^1$H NMR (CD$_3$NO$_2$/AlCl$_3$, 300 MHz, TMS) δ, ppm, 7.4 (s2H), 7.9–8.4 (broad peaks, 8H), 9.0 (s,2H).

EXAMPLE 5

Preparation of Poly(benzobisthiazole-1,4-phenylenebisvinylene)

2,5-Diamino-1,4-benzenedithiol (DABDT) (1.8 g, 4.08 mmol) was dissolved in 77% deaerated PPA (25 g) under a nitrogen atmosphere in a glass reactor of the type described in Example 1. The resultant dehydrochlorination reaction was conducted after 30 minutes purge with nitrogen at 70° C. under vacuum.

The resultant reaction mixture was cooled to 50° C. and contacted with 1,4-phenylene diacrylic acid (PDAA) (0.89 g, 4.08 mmol). P$_2$O$_5$ (10.5 g) was added under positive pressure to compensate for the calculated theoretical water of condensation. The reaction mixture was raised to 60° C. and held at this temperature for eight hours. The temperature was further raised to 100°–120° C. and maintained in this temperature range for an additional 22 hours. The polymerization dope product of this reaction was poured into a beaker and precipitated with 500 ml deionized water. The fibrous precipitate was shredded with a blender and purified by stirring in a large volume of deionized water for three days. The product was dried in a vacuum oven at 60° C. and was obtained in a yield of approximately 100%.

The product of this polymerization reaction, poly (benzobisthiazole-1,4-phenylenebisvinylene) (PBTPV), was characterized by both FTIR and $^1$H NMR spectra. These spectra were as follows:

FTIR (free standing film cm$^{-1}$) 3033, 3000, 2923, 2852, 1622, 1558, 1516, 1489, 1418, 1403, 1312, 1265, 1180, 1054, 949, 855, 804, 656;

$^1$H NMR (CD$_3$NO$_2$/GaCl$_3$, 300 MHz, TMS) δ, ppm, 9.0 (s,2H), 8.4–8.5 (m,4H), 8.1 (s,2H), 8.0 (s,2H).

EXAMPLE 6

Preparation of Poly(p-biphenylene Benzobisthiazole)

2,5-Diamino-1,4-benzenedithiol dihydrochloride (DABDT) (1.3 g, 5.3 mmol) was dehydrochlorinated in 77% deaerated PPA (13.7 g) in accordance with the procedure of Example 1. The product obtained in the glass reactor, was cooled to 50° C. and then 4,4'-diphenyldicarboxylic acid (1.28 g, 5.3 mmol) and P$_2$O$_5$ (6.7 g) were added under a nitrogen purge. The reaction mixture, under slow stirring, was heated to 100° C. for 4 hours, followed by heating at 140° C. for 8 hours and finally heating at 180° C. for 24 hours.

The polymerization dope was allowed to cool to room temperature and the polymer precipitated in water. The polymer was shredded into small pieces with a blender to facilitate purification which involved extraction with a large volume of water, over 2 days.

The product of this polymerization poly(p-biphenylene benzobisthiazole) (PBBZT), was characterized by nuclear magnetic resonance as follows:

[$^1$H NMR: CD$_3$NO$_2$/AlCl$_3$, δ ppm: 9.2, 2H; 8.5, 4H; 8.3, 4H]

EXAMPLE 7

Preparation of Poly(2,6-naphthyl Benzobisthiazole)

DABDT (1.0 g, 4.08 mmol), was dissolved in 77% deaerated PPA (9.8 g) and dehydrochlorinated at 70° C.

2,6-Naphthalene dicarboxylic acid (0.88 g, 4.08 mmol) was added to the completely dehydrochlorinated product along with P$_2$O$_5$ (5.0 g). The heating regime and purification steps used in the polymerization of the polymer of Example 6 was repeated.

The product of this polymerization, poly(2,6-naphthyl benzobisthiazole) (2,6-PNBT), was characterized by nuclear magnetic resonance as follows:

[$^1$HNMR: CD$_3$NO$_2$/AlCl$_3$, δ ppm: 9.3, 2H; 8.5, 4H; 8.2, 2H]

EXAMPLE 8

Preparation of Poly(1,4-naphthyl Benzobisthiazole)

The procedure of Example 7 was identically reproduced except for the substitution of an identical amount of 1,4-naphthalene dicarboxylic acid for the 2,6-naphthalene dicarboxylic acid of Example 7.

The product of this example, poly(1,4-naphthylbenzobisthiazoic) (1,4-PNBT), was characterized by nuclear magnetic resonance as follows:

[$^1$H NMR: CD$_3$NO$_2$/AlCl$_3$, δ ppm: 9.4, 2H; 8.6, 4H; 8.1, 2H]

EXAMPLE 9

Preparation of Poly(benzobisthiazole Decamethylene)

The procedure of Example 6 was repeated but for the substitution of decanedioic acid for the 4,4'-biphenylene dicarboxylic acid of Example 6.

This procedure resulted in the formation of poly (benzobisthiazole decamethylene) (PBTC10). This polymer was characterized by both nuclear magnetic resonance and infrared spectra as follows:

[$^1$H NMR: CD$_3$NO$_2$/AlCl$_3$, δ ppm: 8.9, 2H; 3.6, 4H; 2.0, 4H; 1.2–1.7, 12H]

FTIR (free standing film, cm$^{-1}$) 2922, 2850, 1532, 1426, 1404, 1308, 1161, 1054, 859.

EXAMPLES 10 TO 12

Preparation of Other Poly(benzobisthiazole Methylenes)

The synthesis of poly(benzobisthiazole docamethylene) of Example 9 was repeated in three additional examples wherein decanedioic acid was replaced with octanedioic acid, nonanedioic acid, and undecanedioic acid, respectively to produce poly(benzobisthiazole octamethylene) (PBTC8), poly(benzobisthiazole nonmethylene) (PBTC9), and poly (benzobisthiazole undecamethylene) (PBTC11), respectively.

These polymers were characterized by nuclear magnetic resonance data as follows:
(PBTC8)
$^1$H NMR [δ, ppm: 1.2–1.7, 2.0, 3.6, 8.9]
PBTC9
$^1$H NMR [δ, ppm: 1.2–1.7, 2.0, 3.6, 8.9]
PBTC11
$^1$H NMR [δ, ppm: 1.2–1.7, 2.0, 3.6, 8.9]
HOOC (CH$_2$)$_8$ COOH

EXAMPLE 13

Preparation of Poly(benzobisthiazole Vinylene)

2,5-Diamino-1,4-benzenedithiol dihydrochloride (DABDT) (1.667 g, 6.8 mmol) was dehydrochlorinated with 77% deaerated PPA (18.5 g) in accordance with the procedure of Example 1. Fumaric acid (0.789 g, 6.8 mmol) and $P_2O_5$ (9 g) were added to the dehydrochlorinated product, the latter compound to compensate for the water of condensation. The temperature was gradually raised to 120° C. over six hours and then to 160° C. and finally to 180° C. The polymerization mixture became shiny dark green and the reaction was allowed to proceed for eight hours at 180° C. At that time the polymeric dope was precipitated in water. The polymer thus formed was shredded into tiny pieces with a blender to facilitate purification. Purification involved extraction with water for two days.

The product of this polymerization, poly (benzobisthiazole vinylene) (PBTV), was characterized by FTIR spectra. This data is as follows:

FTIR (free standing film, cm$^{-1}$): 1663, 1600, 1515, 1400, 1313, 1052, 944, 856, 689.

EXAMPLE 14

Preparation of Poly(benzobisthiazole Divinylene)

DABDT (4.31 g, 17.57 mmol) was dehydrochlorinated in accordance with the procedure of Example 13. This product was then reacted with trans,trans-muconic acid (2.5 g, 17.57 mmol) with the concurrent addition of $P_2O_5$ to compensate for the water of condensation. The thus formed mixture was raised to a temperature of 80° C. and held at that temperature for six hours. The temperature was thereupon raised to 120° C. for 10 additional hours. The resultant polymerization product was precipitated in water and thereafter shredded into tiny pieces with a blender. The polymer was purified by extraction in water for 2 days.

The product of this polymerization reaction, poly (benzobisthiazole divinylene) (PBTDV), was characterized by IR spectra data. This data is as follows:

FTIR (free standing film, cm$^{-1}$): 1601, 1480, 1400, 1315, 1053, 974, 845, 680.

EXAMPLE 15

New Process for Preparing Polybenzobisthiazole

DABDT (3.87 g, 15.78 mmol) was dissolved in deaerated 77% PPA (14.66 g) and dehydrochlorinated at 70° C. under vacuum in accordance with the procedure of Example 1. Oxalic acid (1.42 g, 15.78 mmol) was added together with $P_2O_5$ (12 g) under positive pressure. The temperature of this reaction mixture was gradually raised to 120° C. over ten hours, subsequently to 140° C. and finally to 180°–200° C. The reaction continued at this elevated temperature (180°–200° C.) for 24 hours. The polymerization dope in PPA was precipitated in water and purified by extraction of the PPA with water for two days.

The product of this polymerization reaction, polybenzobisthiazole (PBBT), was characterized by infrared spectra data. That data is as appears below:

FTIR (free standing film, cm$^{-1}$): 1467, 1406, 1313, 889, 860, 685.

EXAMPLE 16

Preparation of Light Emitting Diodes

Polymeric films of twelve polymers including a repeating structural unit within the contemplation of formulae VII to XXII were formed into light emitting diodes by depositing the polymer on a glass substrate such that the polymer was present in a thickness of 300 to 1,000 Angstroms. The glass substrate upon which the polymers were deposited, had previously been coated with conductive layer of indium tin oxide. Upon disposition of the polymeric film on the substrate, a thin film layer of aluminum was deposited thereover. Electrical conducting conduits were connected to the aluminum and indium tin oxide.

EXAMPLES 17 TO 28

Light Emitting Properties of Polymeric Films

Polymeric films within the scope of the present invention were tested to determine their light emitting properties by imposing a voltage across the light emitting diodes prepared in Example 16. This determination involved providing a voltage source in electrical communication with the electrical conduits connected to the aluminum layer and the conductive indium tin oxide layer of the glass substrate.

Initially, an EMF of 1 volt was applied. This was slowly increased to a maximum of about 20 volts. The wavelength color and intensity of any light emission resulting therefrom was observed. From this data the quantum efficiency of fluorescence, $\phi_f$ is determined. $\phi_f$ is the fraction of the excited carriers that combine radiatively. The higher this quantum efficiency the better is the polymer as a light emitting source most polymers do not possess this property and have a $\phi_f$ of 0.

The polymeric films, within the contemplation of the present invention, which were tested as light emitters are summarized in the Table below. This table includes $\phi_f$, the wavelength of maximum light emission and the color of that light emission.

TABLE

| Exam No. | Polymer | Thin Film $\Phi_f$, % | Wavelength of Max. Emission, nm | Color of Light Emitted |
|---|---|---|---|---|
| 17 | PBO[1] | 10.4 | 500 | Green |
| 18 | PBZT[2] | 8.0 | 560 | Yellow |
| 19 | PBTPV | 4.0–5.0 | 640 | Red |
| 20 | 2,6-PNBT | 4.0–5.0 | 578 | Yellow |
| 21 | 1,4-PNBT | 4.0–5.0 | 572 | Yellow |
| 22 | PBBZT | 4.0–5.0 | 536 | Green |
| 23 | BBL[3] | <10$^{-3}$ | 740 | Near Infrared |
| 24 | PBIV | <10$^{-3}$ | 620 | Orange |
| 25 | PBIDV | <10$^{-3}$ | 652 | Red |
| 26 | PBIPV | <10$^{-3}$ | 638 | Red |
| 27 | PBZI | <10$^{-3}$ | 560 | Yellow |
| 28 | PBBI | <10$^{-5}$ | Below S/N[4] | — |

[1]Poly(p-phenylene benzobisoxazole)
[2]Poly(p-phenylene benzobisthiazole)
[3]Polybenzimidozolebenzophenyanthiolane-type ladder (Polymeric having repeating structure of Formula XIII)
[4]Signal to Noise ratio.

The above embodiments and examples are provided to illustrate the scope and spirit of the present invention. These embodiments and examples will make apparent, to those skilled in the art, other embodiments and examples. These other embodiments and examples are within the contemplation of the present invention. Therefore, the present invention should be limited only by the appended claims.

What is claimed is:

1. A light emitting diode comprising a film, the polymer of which includes at least one repeating structural unit selected from the group consisting of

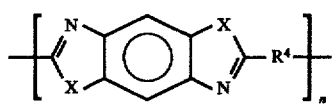

where X is sulfur, —NR$^1$ or oxygen; R$^1$ is hydrogen or hydrocarbyl; R$^4$ is nil,

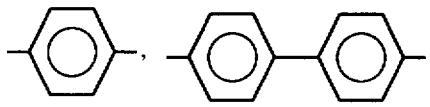

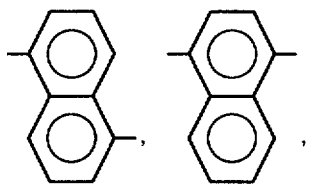

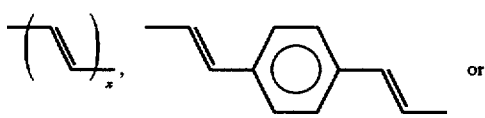 or when X is sulfur or oxygen; R$^4$ is nil;

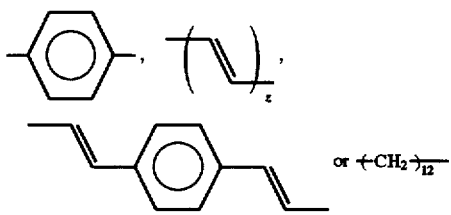

when X is —NR$^1$, x is 1 or 2; y is an integer of 8 to 11; z is 1 or 2; and n is 2 to 2,000,

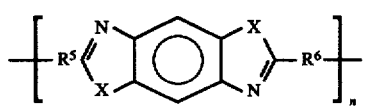

where R$^5$ is

when R$^6$ is

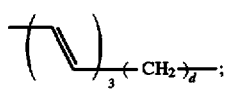

R$^5$ is

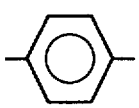

when R$^6$ is

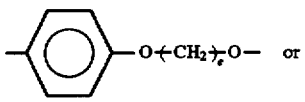

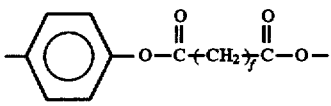

d is an integer of 1 to 5; e is an integer of 1 to 18; f is an integer of 1 to 18; and X, R$^1$ and n have the meanings given above;

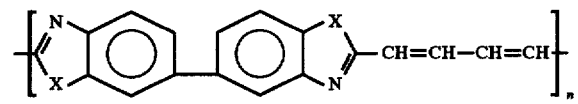

where X, R$^1$ and n have the meanings given above,

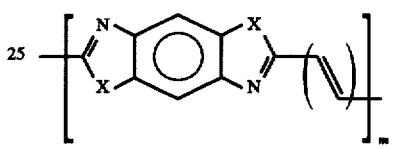

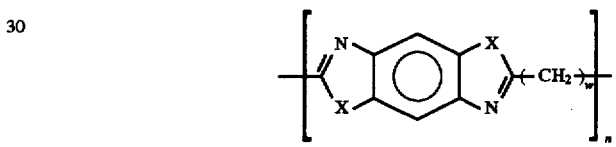

where m is an integer of 2 to 2,000; w is 0 or an integer of 1 to 18; and X, R$^1$ and n have the meanings given above,

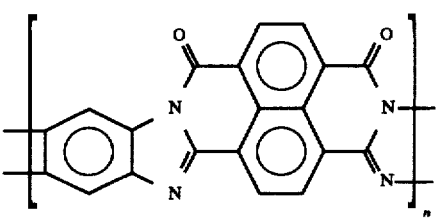

where n has the meaning given above

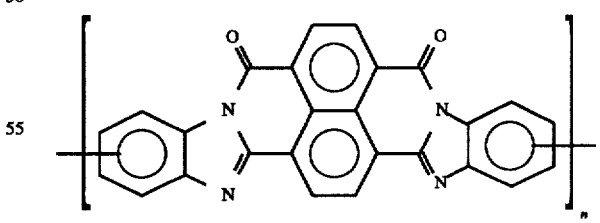

where n has the meaning given above

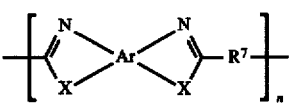

where Ar is
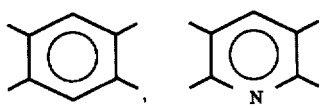,
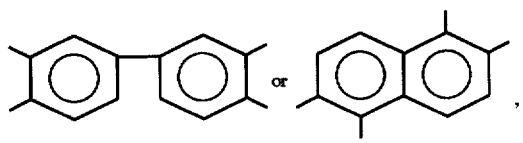,
$R^7$ is 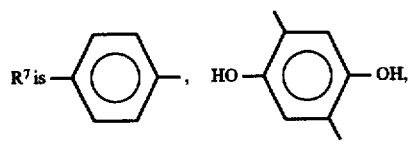,
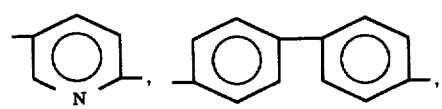,
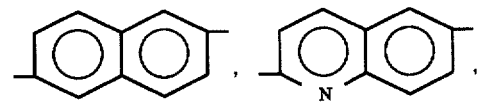,
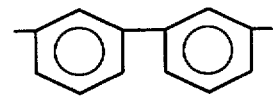,
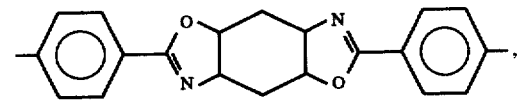,
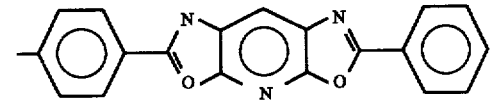,
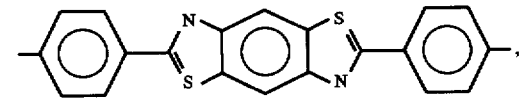,
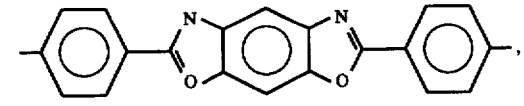,
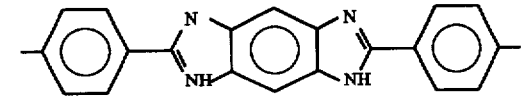,
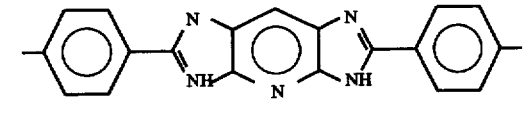,
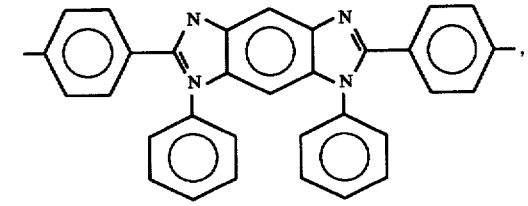,
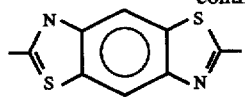
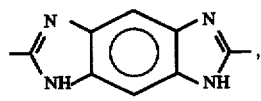,
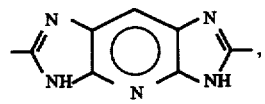,
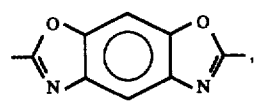,
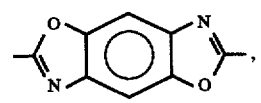,
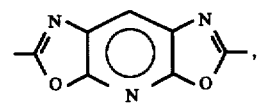,
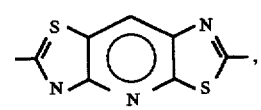,
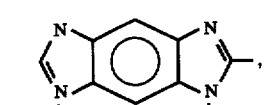,
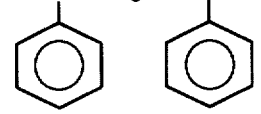,
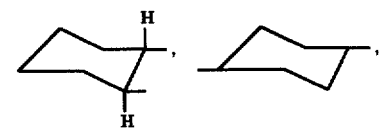,
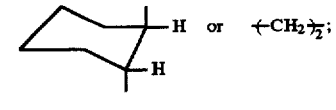
and n is an integer of 2 to 2000.
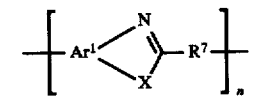
where $Ar^1$ is
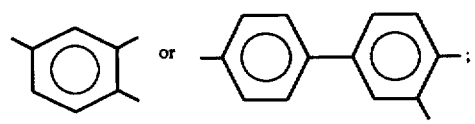;

and X, R¹ and n have the meanings given above,

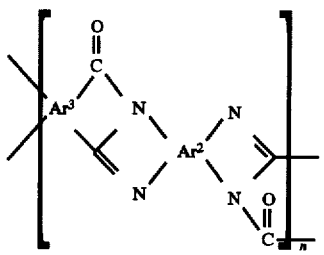

where Ar² is

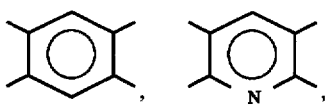

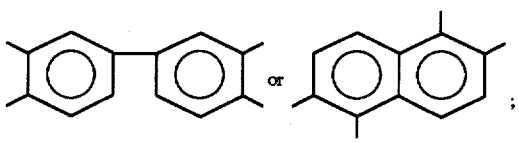

Ar³ is

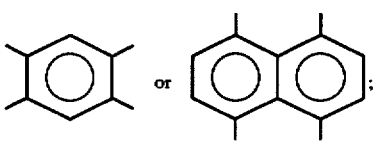

and n has the meaning given above,

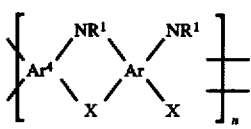

where Ar⁴ is

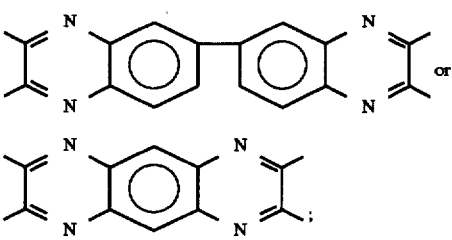

and Ar, X, R¹ and n have the meanings given above,

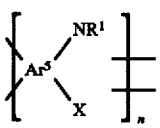

where Ar⁵ is

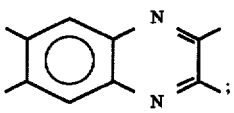

and X, R¹ and n have the meanings given above,

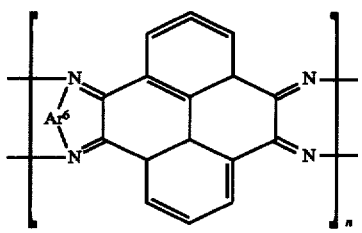

Ar⁶ is

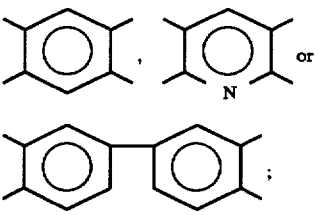

and n has the meaning given above and

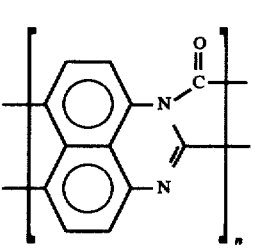

where n has the meaning given above.

2. A diode in accordance with claim 1 wherein said polymeric film comprises at least one electrically conductive ion-implant layer.

3. A diode in accordance with claim 2 wherein said ion polymeric film includes a p-type ion implant layer.

4. A diode in accordance with claim 2 wherein said polymeric film includes an n-type ion implant layer.

5. A diode in accordance with claim 2 wherein said polymeric film includes a p-type implant layer, an n-type implant layer and a non-conductive layer disposed therebetween.

6. A diode in accordance with claim 1 wherein said polymeric film is disposed upon a substrate.

7. A diode in accordance with claim 6 wherein said substrate includes a conducting layer acting as an electrode.

8. A diode in accordance with claim 1 wherein said electrodes are metal.

9. A diode in accordance with claim 8 wherein said metal of said cathode is selected from the group consisting of calcium, aluminum and indium.

10. A diode in accordance with claim 9 wherein said metal of said cathode is selected from the group consisting of calcium and aluminum.

11. A diode in accordance with claim 8 wherein said metal of said anode is selected from the group consisting of gold and platinum.

12. A diode in accordance with claim 11 wherein said metal of said anode is gold.

13. A diode in accordance with claim 6 wherein said substrate is a material selected from the group consisting of glass, polycarbonate and poly(methylmethacrylate).

14. A diode in accordance with claim 6 wherein said substrate is a material selected from the group consisting of glass, polycarbonate and poly(methylmethacrylate) and said conducting layer thereof is selected from the group consisting of a metal, indium tin oxide, polyanaline and an ion implant polymer which includes at least one repeating structural unit selected from the group consisting of polymers utilized in the polymeric film.

15. A diode in accordance with claim 3 wherein ions of helium, neon, argon, krypton, xenon, fluorine, chlorine, bromine or iodine are implanted to provide said p-type implant layer.

16. A diode in accordance with claim 5 wherein ions of helium, neon, argon, krypton, xenon, lithium, sodium or potassium are implanted to provide said n-type implant layer.

17. A diode in accordance with claim 5 wherein ions of fluorine, chlorine, bromine, or iodine and implanted to provide said p-type implant layer and ions of lithium, sodium or potassium are implanted to provide said n-type layer.

18. A diode in accordance with claim 1 wherein said electrodes are metal and are completely disposed over said first and second surfaces of said polymeric film whereby a light emitting diode of longitudinal geometry is formed.

19. A diode in accordance with claim 18 wherein said polymeric film includes an n-type ion implant layer on the surface adjacent the cathode, a p-type ion implant layer on the surface adjacent the anode and or non-conductive layer therebetween.

20. A diode in accordance with claim 7 wherein said conducting layer acts as an anode and a cathode is provided by a metal which completely covers the side of the polymeric film opposite said side in contact with said substrate whereby a diode of transverse geometry is formed.

21. A diode in accordance with claim 5 comprising a metal cathode disposed over a portion of said n-type ion implant layer and a metal anode disposed over a portion of said p-type implant layer whereby a diode of transverse geometry is formed.

22. A diode in accordance with claim 4 comprising a metal cathode disposed over a portion of said n-type implant layer; and a substrate upon which the non-conducting surface of said polymeric film, opposite said n-type implant layer, is disposed, said substrate provided with a conducting layer, in contact with said polymeric film, which acts as an anode whereby a diode of transverse geometry is formed.

23. A diode in accordance with claim 4 comprising a metal cathode disposed over a portion of said n-type ion implant layer of said polymer film; a substrate provided with a p-type ion implant layer in contact with the non-conducting surface of said polymeric film; and a metal anode disposed over a portion of said p-type implant layer of said substrate whereby a diode of transverse geometry is formed.

24. A diode in accordance with claim 6 wherein said polymeric film includes a p-type ion implant and an n-type ion implant disposed on the same surface of said polymeric film, said p-type and n-type ion implants covered by a metal anode and a metal cathode, respectively, whereby a diode of transverse geometry is formed.

25. A diode in accordance with claim 1 wherein said polymeric film is poly(p-phenylene benzobisoxazole).

26. A diode in accordance with claim 1 wherein said polymeric film is poly(p-phenylene benzobisthiazole).

27. A diode in accordance with claim 1 wherein said polymeric film is poly(p-phenylene benzobisimidazole).

28. A diode in accordance with claim 1 wherein said polymeric film is poly(benzobisthiazole-1,4-phenylene bisvinylene).

29. A diode in accordance with claim 1 wherein said polymeric film is poly(bisphenylenebiothiazole).

30. A diode in accordance with claim 1 wherein said polymeric film is poly(2,6-naphthyl benzobisthiazole).

31. A diode in accordance with claim 1 wherein said polymeric film is poly(1,4-naphthyl benzobisthiazole).

* * * * *

UNITED STATES PATENT AND TRADEMARK OFFICE
CERTIFICATE OF CORRECTION

PATENT NO. : 5,726,282
DATED : March 10, 1998
INVENTOR(S) : Samson A. Jenekhe, et al.

It is certified that error appears in the above-identified patent and that said Letters Patent is hereby corrected as shown below:

Column 5, line 17, (Diagram): "⏋" should read --⏋n--

Column 6, line 5, (Diagram): "⏋" should read --⏋n--

Column 7, line 43, (Diagram): "⏋" should read --⏋n--

Column 15, line 45: "copied" should read --cooled--

Column 23, line 15: "XXI" should read --XVI--

Column 23, line 17: "XVI, XVIII" should read --XVI and XVIII--

Column 32, line 65: "a film" should read --a polymeric film--

Signed and Sealed this

Twenty-eighth Day of March, 2000

Attest:

Q. TODD DICKINSON

*Attesting Officer*  *Commissioner of Patents and Trademarks*